US006908316B2

(12) United States Patent
Ma et al.

(10) Patent No.: US 6,908,316 B2
(45) Date of Patent: Jun. 21, 2005

(54) ELECTRICAL CONNECTOR WITH ACCURATE MEASURING BENCHMARKS

(75) Inventors: Hao-Yun Ma, Tu-chen (TW); Genn-Sheng Lee, Tu-Chen (TW); Ming-Lun Szu, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/685,836

(22) Filed: Oct. 14, 2003

(65) Prior Publication Data

US 2004/0242058 A1 Dec. 2, 2004

(30) Foreign Application Priority Data

Feb. 27, 2003 (TW) ........................................ 92203129 U

(51) Int. Cl.[7] .............................................. H01R 12/00
(52) U.S. Cl. ........................................ 439/73; 439/331
(58) Field of Search ................................. 439/330, 331, 439/70, 71, 73

(56) References Cited

U.S. PATENT DOCUMENTS

| | | | | |
|---|---|---|---|---|
| 4,427,249 A | * | 1/1984 | Bright et al. .................. | 439/68 |
| 4,504,105 A | | 3/1985 | Barkus et al. | |
| 4,621,884 A | | 11/1986 | Berkebile, Jr. et al. | |
| 4,647,124 A | * | 3/1987 | Kandybowski ................ | 439/71 |
| 4,846,703 A | * | 7/1989 | Matsuoka et al. ............. | 439/71 |
| 4,984,997 A | * | 1/1991 | Korsunsky et al. ............ | 439/73 |
| 5,104,327 A | * | 4/1992 | Walburn ....................... | 439/71 |
| 5,302,853 A | | 4/1994 | Volz et al. | |
| 5,493,237 A | * | 2/1996 | Volz et al. .................... | 439/71 |
| 5,713,744 A | * | 2/1998 | Laub ............................ | 439/71 |
| 6,164,980 A | * | 12/2000 | Goodwin ...................... | 439/70 |
| 6,644,981 B2 | * | 11/2003 | Choy ........................... | 439/70 |
| 6,699,047 B1 | * | 3/2004 | McHugh et al. .............. | 439/71 |
| 2004/0166703 A1 | * | 8/2004 | McHugh et al. .............. | 439/71 |

* cited by examiner

*Primary Examiner*—Tho D. Ta
(74) *Attorney, Agent, or Firm*—Wei Te Chung

(57) ABSTRACT

An electrical connector includes a base (2'), a metal clip (3) pivotably engaged on the base, and a lever (4) for fastening the clip onto the base. A floor (232') is defined in a middle of the base. A rectangular raised support area (23') is provided around a periphery of the floor. The support area defines four inner side walls (231'). The side walls and the floor cooperatively define a substantially rectangular cavity (230') therebetween. One of the side walls defines a pair of protrusions (2310') protruding towards the cavity, wherein the two protrusions are coplanar with each other. The other side walls define a protrusion thereof respectively. Therefore, a first benchmark is obtained by a line joining the pair of protrusions on the side wall, and a second benchmark is determined by a line passing the protrusion on the adjacent and perpendicular side wall, perpendicular to the first benchmark.

19 Claims, 5 Drawing Sheets

US 6,908,316 B2

ELECTRICAL CONNECTOR WITH ACCURATE MEASURING BENCHMARKS

BACKGROUND OF THE INVENTION

1. Field of the Invention

The present invention relates to an electrical connector for electrical connecting an electronic package such as an integrated circuit (IC) chip with a circuit substrate such as a printed circuit board (PCB), and particularly to a connector adapted for receiving a land grid package (LGP) therein and electrically connecting the LGP with a PCB.

2. Description of the Prior Art

Land grid array (LGA) connectors for connecting a Land Grid Package (LGP) with a printed circuit board (PCB) are widely used in the field of electrical connectors.

Referring to FIGS. 6–7, a conventional Land Grid Array (LGA) connector is illustrated. The LGA connector 6 comprises an insulative base 50 mounted on a printed circuit board (not shown), a metal clip 51 pivotably engaged on one end of the base 50, and a lever 52 engaged on an opposite end of the base 50 for fastening the clip 51 onto the base 50. The base 50 is substantially rectangular. A floor 502 is defined in a middle of the base 50. A rectangular raised support area 501 is provided around a periphery of the floor 502. The support area 501 defines four inner side walls 503. The side walls 503 and the floor 502 cooperatively define a substantially rectangular cavity therebetween. A plurality of passageways is defined in the floor 502, for receiving a corresponding number of electrical contacts (not shown) therein. Examples of this kind of electrical are disclosed in U.S. Pat. Nos. 4,504,105, 4,621,884, and 5,302,853.

In manufacturing, the size of the cavity is determined by the size or type of an LGP 7. Commonly, the side walls 503 of the cavity loosely contact corresponding side edges of the LGP 7 when the LGP 7 is mounted in the cavity, thereby preventing the LGP 7 from being displaced to an incorrect position. Therefore, it is very important to measure the cavity accurately for the purposes of quality control prior to the connector being mounted on the printed circuit board. In practice, the side walls 503 are usually used as benchmarks for such measuring.

However, one problem with this type of electrical connector is that warpage of the support area 501 is very common in manufacturing of the base 50. This bends the side walls 503, as shown with broken lines in FIG. 7. Therefore, the warped side walls 503 cannot be used as benchmarks for measuring, and it is problematic to accurately measure the cavity.

In view of the above, a new electrical connector which overcomes the above-mentioned disadvantages is desired.

SUMMARY OF THE INVENTION

Accordingly, an object of the present invention is to provide an electrical connector that allows accurate benchmarks for measuring a cavity of a base thereof to be obtained, even if the base is warped during manufacturing.

To achieve the above-mentioned object, an electrical connector in accordance with a first embodiment of the present invention comprises an insulative base mounted on a printed circuit board, a metal clip pivotably engaged on the base, and a lever for fastening the clip onto the base. The base is substantially rectangular. A floor is defined in a middle of the base. A rectangular raised support area is provided around a periphery of the floor. The support area defines four inner side walls. The side walls and the floor cooperatively define a substantially rectangular cavity therebetween. One of the side walls defines a pair of protrusions with inner surface extending into the cavity, wherein the inner surfaces of the two protrusions are parallel to the side wall, and are coplanar with each other. The other three side walls each define a single protrusion extending perpendicularly therefrom.

Therefore, a first benchmark is obtained by a line joining the inner surfaces of the pair of protrusions on the side wall, and a second benchmark is then obtained by a line joining the first benchmark A and the inner surface of the single protrusion on an adjacent perpendicular side wall. In addition, further embodiments of the present invention are disclosed.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
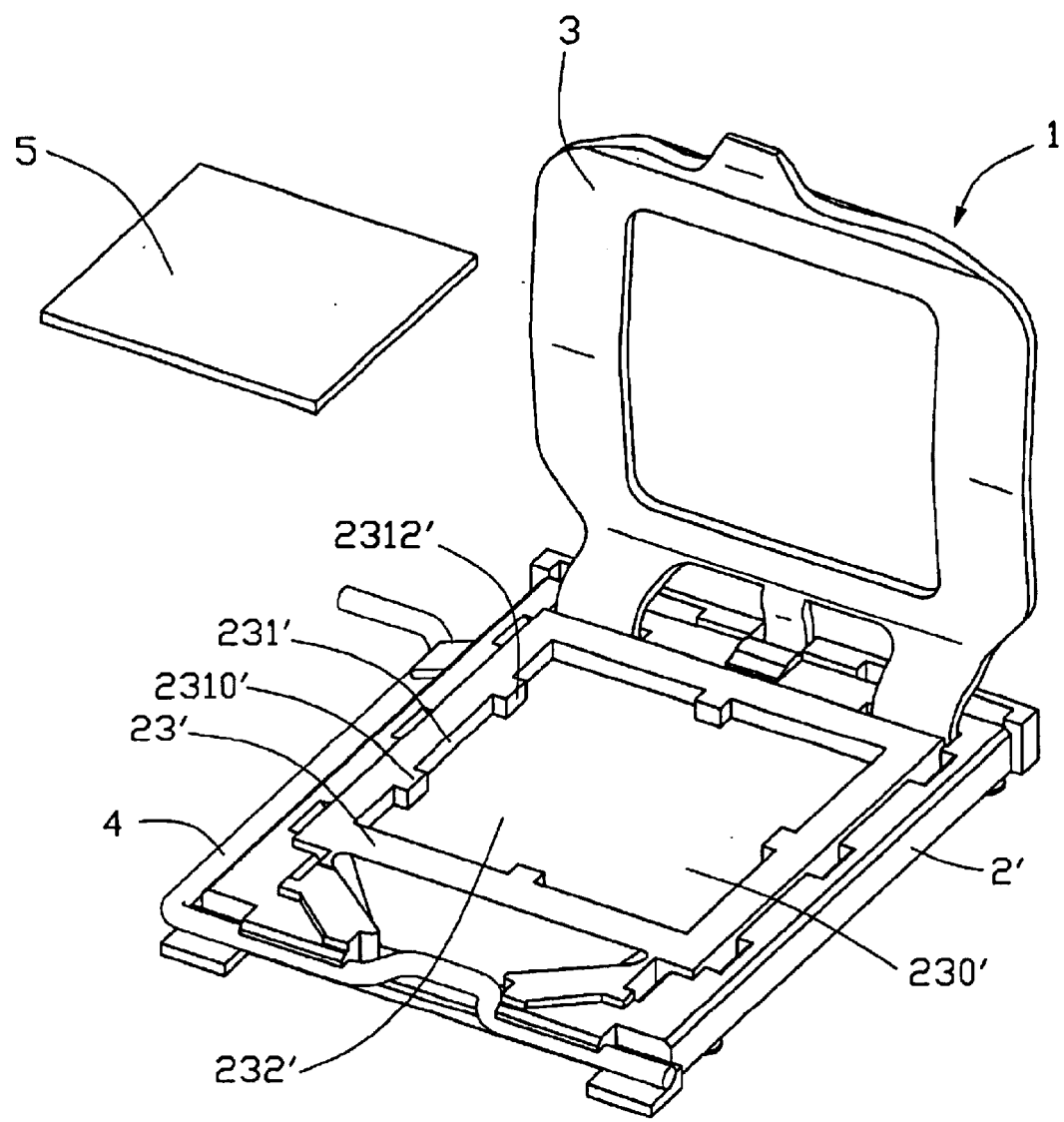
FIG. 1 is an isometric view of an electrical connector in accordance with embodiment of the present invention, together with an LGP ready to be in a cavity of a support area of the electrical connector.
Figure 2:
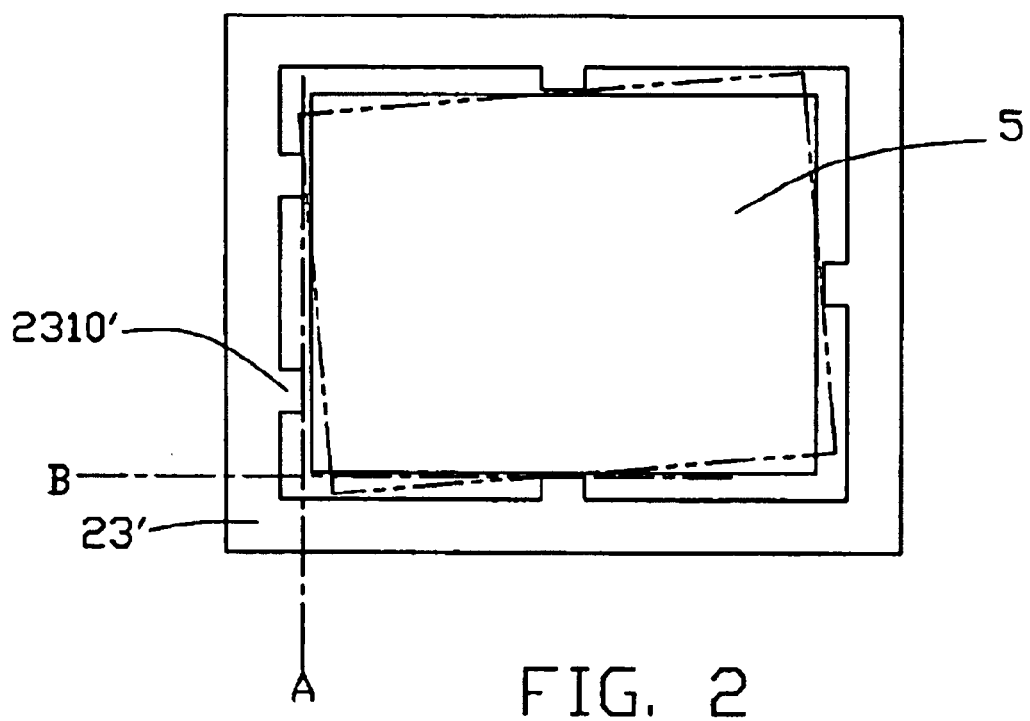
FIG. 2 is a top plan view of the LGP mounted in the cavity of the support area of the electrical connector of FIG. 1.

Referring to FIGS. 1–2, an electrical connector 1 in accordance with the first embodiment of the present invention comprises an insulative base 2' mounted on a printed circuit board (not shown), a metal clip 3 pivotably engaged on one end of the base 2', and a lever 4 engaged on an opposite end of the base 2' for fastening the clip 3 onto the base 2'. A Land Grid Package (LGP) 5 is disposed between the base 2' and the clip 3, for connecting with the printed circuit board via the connector 1.

The base 2' is substantially rectangular. A floor 232' is defined in a middle of the base 2'. A rectangular raised support area 23' is provided around a periphery of the floor 232'. The support area 23' defines four inner side walls 231'. The side walls 231' and the floor 232' cooperatively define a substantially rectangular cavity 230' therebetween. A plurality of passageways is defined in the floor 232', for receiving a corresponding number of electrical contacts (not shown) therein.

A pair of separated protrusions 2310' extends perpendicularly from one side wall 231' into the cavity 230'. Each protrusion 2310' is parallelepiped-shaped, and defines an inner surface 2312' parallel to the side wall 231'. The inner surfaces 2312' are coplanar. The other three side walls 231' each have a single protrusion 2310' extending perpendicularly therefrom. All the protrusions 2310' of the side walls 231' cooperatively define a receiving room in the cavity 230', for receiving the LGP 5 therein.

In use of the connector 1, the LGP 5 is disposed in the receiving room between the protrusions 2310' of the side wall 231'. The clip 3 is rotated downwardly to a horizontal closed position, and the clip 3 is fastened to the base 2' by the lever 4.

In measuring, a first benchmark A can be easily obtained by a line joining the inner surfaces 2312' of the two protrusions 2310' of the same side wall 213', even if the side wall 231' has warped during manufacturing. Then a second benchmark B can be obtained by a line joining the first benchmark A and the inner surface 2312' of the protrusion 2310' of an adjacent perpendicular side wall 231'. In similar fashion, benchmarks of the other two side walls 231' can also be obtained by lines joining corresponding protrusions 2310'. Therefore, the receiving room for accommodating the LGP 5 can be easily measured, for the purposes of quality control prior to the connector 1 being mounted on the printed circuit board. It should be noted that the protrusions 2310' are relatively small compared to the side walls 231'. In addition, the two protrusions 2310' on the same side wall 231' are disposed far away from each other, and are equidistant from a midpoint of the side wall 231'. Therefore, any warpage of the side wall 231' has little effect on the inner surfaces 2312' of the protrusions 2310', and correspondingly little effect on the first benchmark A and the second benchmark B.

The LGP 5 may rotate in the receiving room of the cavity 230', as shown with broken lines in FIG. 2. This is especially the case if any gaps exist between the inner surfaces 2312' of the protrusions 2310' and corresponding edges of the LGP 5. Any rotation may adversely affect the connection of the LGP 5 with the printed circuit board.

Figure 3:
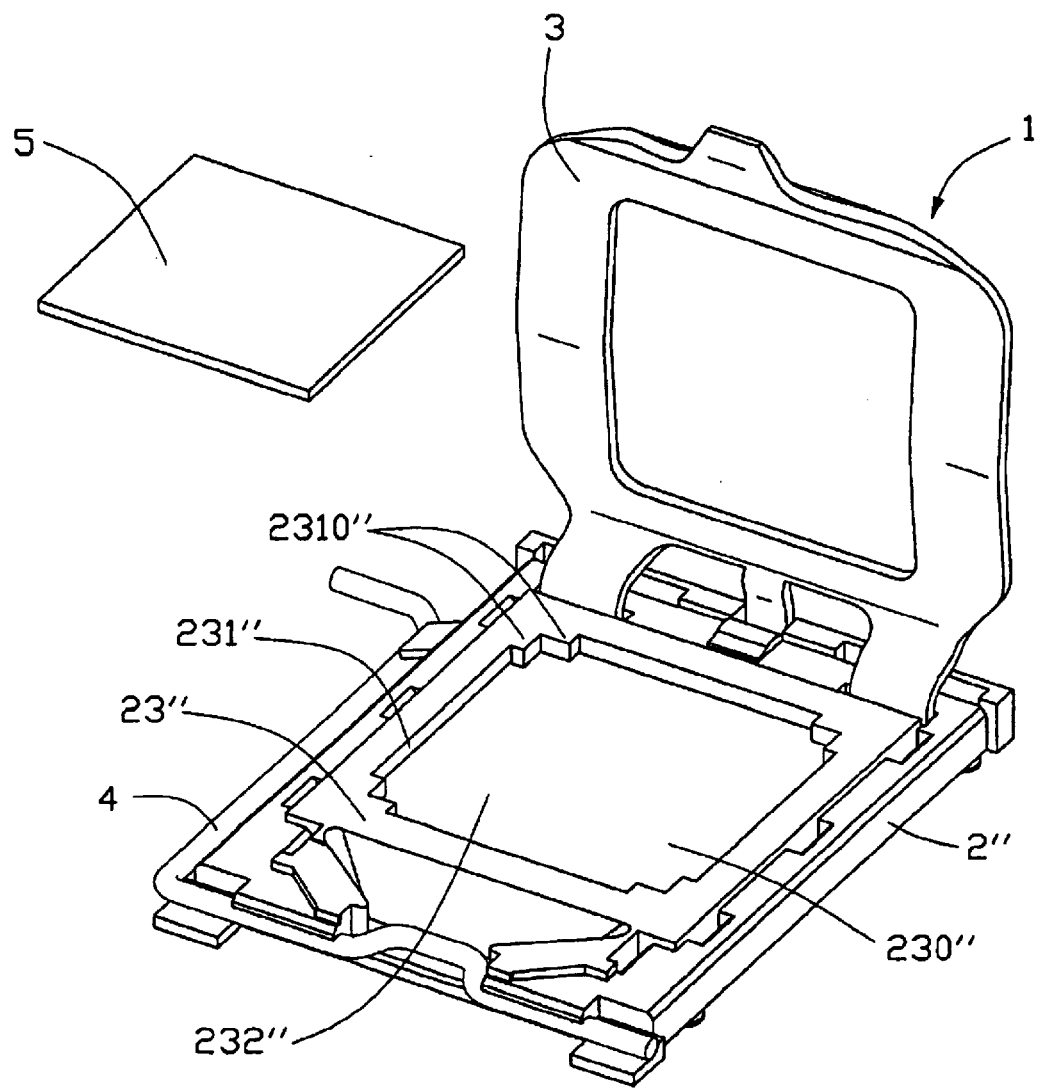
FIG. 3 is an isometric view of an electrical connector in accordance with a second embodiment of the present invention, together with an LGP ready to be mounted in a cavity of a support area of the electrical connector.
Figure 4:
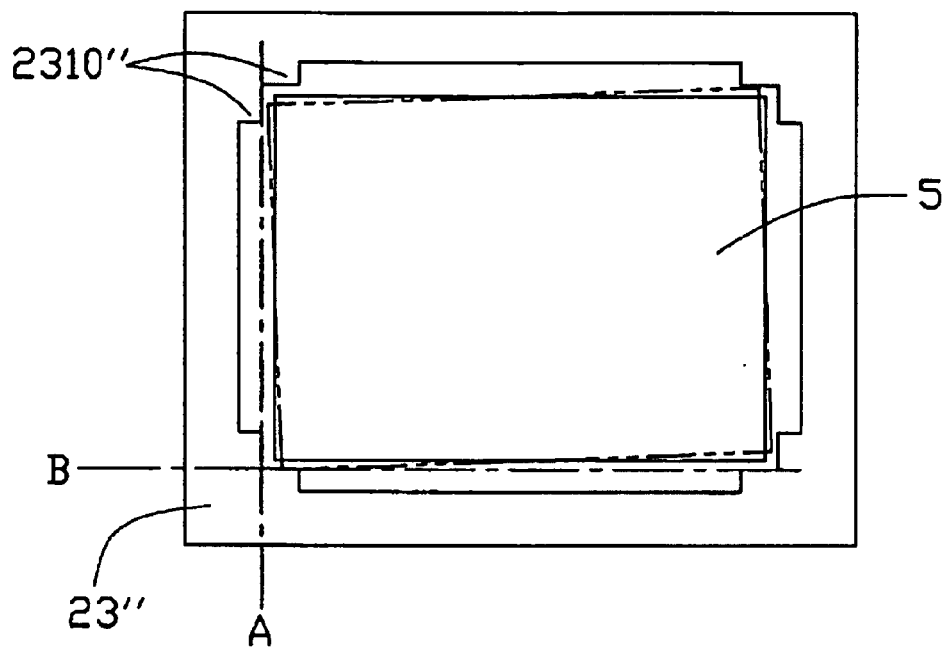
FIG. 4 is a top plan view of the LGP mounted in the cavity of the support area of the electrical connector of FIG. 3.

FIGS. 3–4 relate to an electrical connector in accordance with the second embodiment of the present invention. A base 2" comprises a supporting area 23", and a substantially rectangular cavity 230" is defined in a middle of the supporting area 23". The cavity 230" is bounded by a sunken floor 232" and four surrounding side walls 231". A plurality of passageways (not shown) is defined in the floor 232", for receiving a corresponding number of electrical contacts (not shown) therein. A pair of parallelepiped-shaped protrusions 2310" extends from opposite ends of each side wall 231" into the cavity 230". In addition, two adjacent protrusions 2310" at each of two adjoining side walls 231" are integrally formed together to provide an L-shaped configuration. Inner surfaces of the protrusions 2310" of each side wall 231" are parallel to the side wall 231", and are coplanar with each other.

In use, the LGP 5 is received in the cavity 230", being disposed in a receiving room defined between the protrusions 2310". Because the protrusions 2310" are at ends of the side walls 231", rotation of the LGP 5 in the cavity 230" is effectively limited.

In measuring, a first benchmark A can be easily obtained by joining inner surfaces of two protrusions 2310' of any of the side walls 213'. In similar fashion, a second benchmark B and other benchmarks can also be obtained. Therefore, the receiving room for accommodating the LGP 5 can be easily measured.

Figure 5:
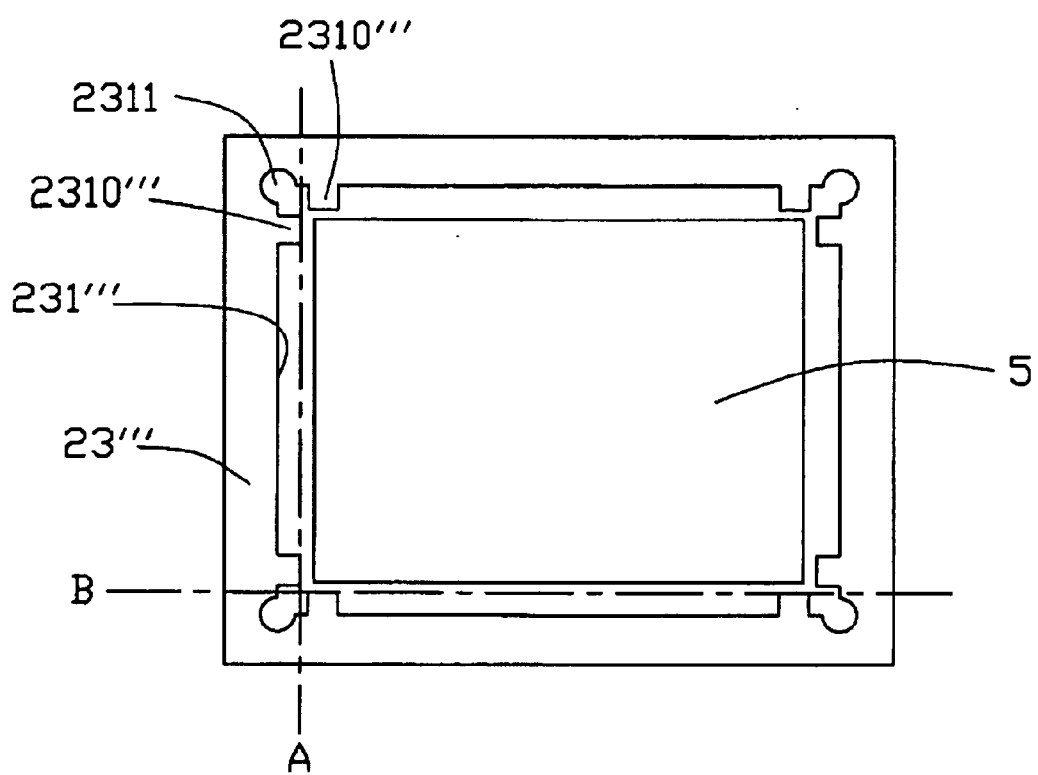
FIG. 5 is a top plan view of an LGP mounted in a cavity of a support area of an electrical connector in accordance with a third embodiment of the present invention.
Figure 6:
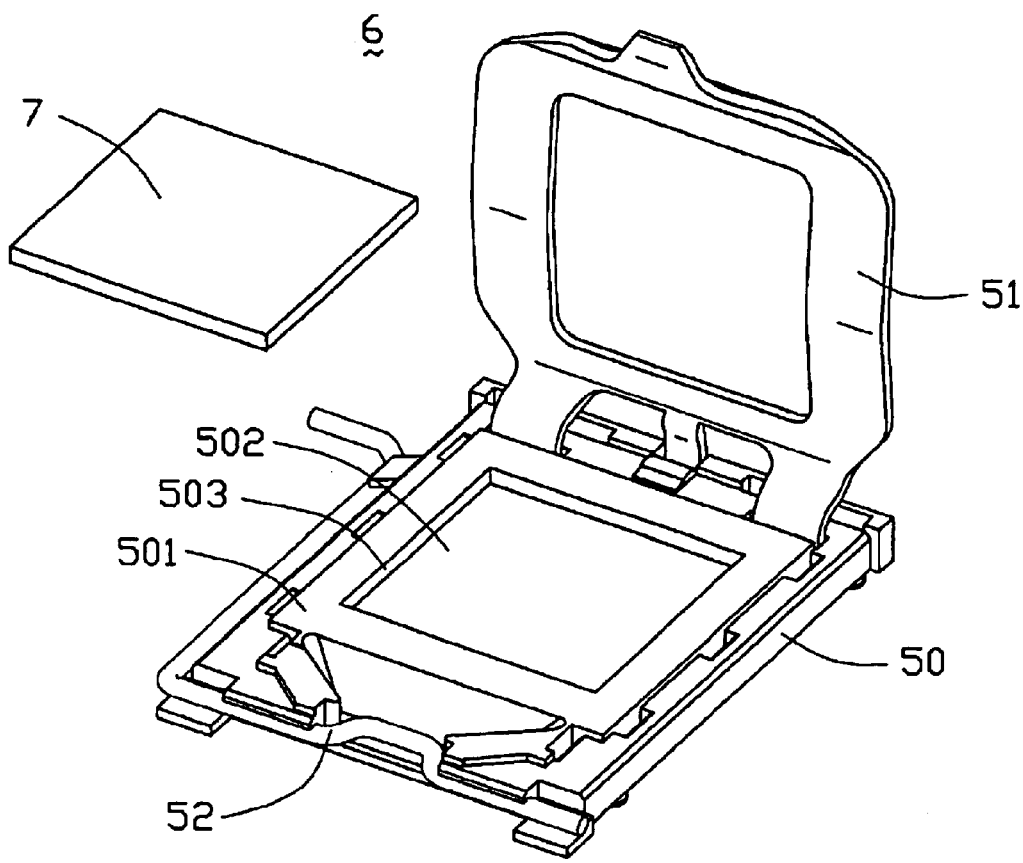
FIG. 6 is an isometric view of a conventional electrical connector, together with an LGP ready to be mounted in a cavity of a support area of the electrical connector.
Figure 7:
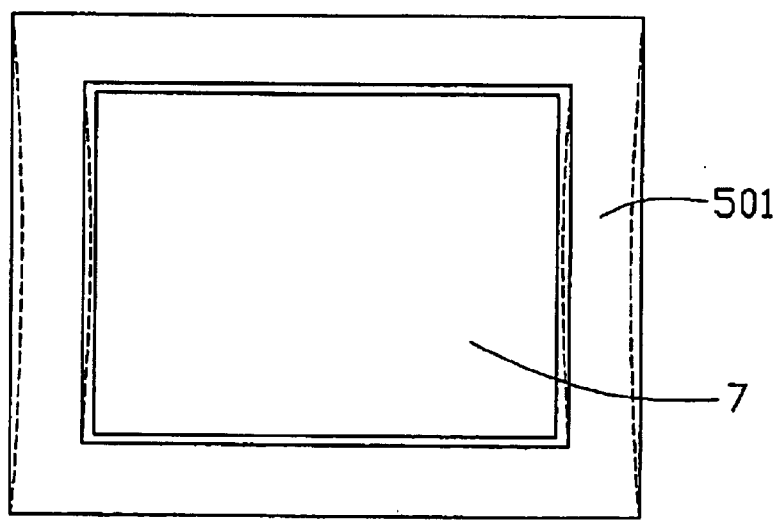
FIG. 7 is a top plan view of the LGP mounted in the cavity of the support area of the electrical connector of FIG. 6.

FIG. 5 relates to an electrical connector in accordance with the third embodiment of the present invention. The third embodiment is similar to the second embodiment, except that a recess 2311 is defined in each corner of a supporting area 23''' where two adjacent protrusions 2310''' of two adjoining side walls 231''' are disposed. The recess 2311 can release stresses in the corner that form during manufacturing of the connector. This helps ensure reliable mechanical and electrical performance of the connector.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. An electrical connector for interconnecting an integrated circuit chip and a printed circuit board, the electrical connector comprising:
   a base comprising a support area, a substantially rectangular cavity in the support area, the cavity being bounded by a floor and a plurality of peripheral side walls;
   wherein each of the side walls defines at least one protrusion thereon extending into the cavity, at least one of the side walls defines at least two protrusions thereon extending into the cavity, and said at least two protrusions extend a same distance from the side wall;
   wherein each of the protrusions has a substantially parallelepiped-shaped configuration.

2. The electrical connector as claimed in claim 1, wherein the base is substantially rectangular.

3. The electrical connector as claimed in claim 1, wherein only one of the side walls defines two protrusions thereon, and each of the other side walls defines only a single protrusion thereon.

4. The electrical connector as claimed in claim 3, wherein the two protrusions on said one side wall are disposed far away from each other, and are equidistant from a midpoint of the side wall.

5. The electrical connector as claimed in claim 1, wherein each of the side walls defines two protrusions thereon.

6. The electrical connector as claimed in claim 5, wherein the protrusions are defined at opposite ends of each of the side walls.

7. The electrical connector as claimed in claim 6, wherein two adjacent protrusions at each of two adjoining side walls are integrally formed together to provide an L-shaped configuration.

8. The electrical connector as claimed in claim 7, wherein a recess is defined at each of corners of the support area where two integrated protrusions are disposed.

9. An electrical connector assembly for interconnecting an integrated circuit chip and a printed circuit board, the electrical connector comprising:
   a base comprising a support area, the support area comprising a floor and a plurality of side walls cooperatively defining a cavity therebetween;
   wherein at least one of the side walls defines at least two protrusions, and each of the other side walls defines one protrusion respectively, each of the protrusions defines an inner surface parallel to the corresponding side wall, and the inner surfaces of said at least two protrusions are coplanar.

10. The electrical connector as claimed in claim 9, wherein the cavity has a substantially rectangular configuration.

11. The electrical connector as claimed in claim 9, wherein each of the protrusions has a substantially parallelepiped-shaped configuration.

12. The electrical connector as claimed in claim 9, wherein the base is substantially rectangular.

13. The electrical connector as claimed in claim 9, wherein only one of the side walls defines two protrusions, and each of the other side walls defines only one protrusion.

14. The electrical connector as claimed in claim 13, wherein the two protrusions on said one side wall are disposed far away from each other, and are equidistant from a midpoint of the side wall.

15. The electrical connector as claimed in claim 9, wherein each of the side walls defines two protrusions.

16. The electrical connector as claimed in claim 15, wherein the protrusions are defined at opposite ends of each of the side walls.

17. The electrical connector as claimed in claim 16, wherein two adjacent protrusions at each of two adjoining side walls are integrally formed together to provide an L-shaped configuration.

18. The electrical connector as claimed in claim 17, wherein a recess is defined at each of corners of the support area where two integrated protrusions are disposed.

19. An electrical component for receiving an integrated circuit chip, comprising:

a base including therein a substantially rectangular cavity defining thereof lengthwise and transverse directions perpendicular to each other;

first, second, third and fourth side walls together surrounding said cavity circumferentially, wherein said first and fourth side walls extend along the lengthwise direction and the second and third side walls extend along the transverse direction;

at least the first side wall defining a pair of substantially protrusions inwardly extending toward the cavity from an inner face thereof; and at least one projection inwardly extending from a corresponding inner face of each of the remaining second, third and fourth side walls toward the cavity; wherein said pair of protrusions on said first side wall are substantially similar to each other and located symmetrically located by two sides of a middle point of said first side wall; whereby under a warpage of said side walls along either the lengthwise or the transverse direction, a first line linked between two respective innermost points of said pair of protrusions is able to be essentially parallel to the lengthwise direction of a true position of the electrical component, so other two second and third lines respectively passing the respective two innermost points of the projections of the second and third side walls, which directly neighbor said first side wall, are in a perpendicular relation with regard to the first line and essentially parallel to the transverse direction, and a fourth line passing the innermost point of the projection of the fourth side wall opposite to the first side wall is in a parallel relation with regard to the first line and essentially parallel to the lengthwise direction, and thus said first, second, third and fourth side walls commonly define a rectangular region for compliance with a contour of said integrated circuit chip, wherein each of said protrusions defines a flat interior face normally facing the cavity.

* * * * *

(12) EX PARTE REEXAMINATION CERTIFICATE (8872nd)
United States Patent
Ma et al.

(10) Number: US 6,908,316 C1
(45) Certificate Issued: Feb. 28, 2012

(54) ELECTRICAL CONNECTOR WITH ACCURATE MEASURING BENCHMARKS

(75) Inventors: Hao-Yun Ma, Tu-chen (TW);
Genn-Sheng Lee, Tu-Chen (TW);
Ming-Lun Szu, Tu-Chen (TW)

(73) Assignee: Hon Hai Precision Ind. Co., Ltd.,
Tu-Chen, Taipei Hsien (TW)

Reexamination Request:
No. 90/009,831, Nov. 2, 2010

Reexamination Certificate for:
Patent No.: 6,908,316
Issued: Jun. 21, 2005
Appl. No.: 10/685,836
Filed: Oct. 14, 2003

(30) Foreign Application Priority Data

Feb. 27, 2003 (TW) .................................. 92203129 U

(51) Int. Cl.
*H01R 12/00* (2006.01)

(52) U.S. Cl. .......................................... 439/73; 439/331
(58) Field of Classification Search .................. None
See application file for complete search history.

(56) References Cited

To view the complete listing of prior art documents cited during the proceeding for Reexamination Control Number 90/009,831, please refer to the USPTO's public Patent Application Information Retrieval (PAIR) system under the Display References tab.

*Primary Examiner* — Karin M. Reichle

(57) ABSTRACT

An electrical connector includes a base (2'), a metal clip (3) pivotably engaged on the base, and a lever (4) for fastening the clip onto the base. A floor (232') is defined in a middle of the base. A rectangular raised support area (23') is provided around a periphery of the floor. The support area defines four inner side walls (231'). The side walls and the floor cooperatively define a substantially rectangular cavity (230') therebetween. One of the side walls defines a pair of protrusions (2310') protruding towards the cavity, wherein the two protrusions are coplanar with each other. The other side walls define a protrusion thereof respectively. Therefore, a first benchmark is obtained by a line joining the pair of protrusions on the side wall, and a second benchmark is determined by a line passing the protrusion on the adjacent and perpendicular side wall, perpendicular to the first benchmark.

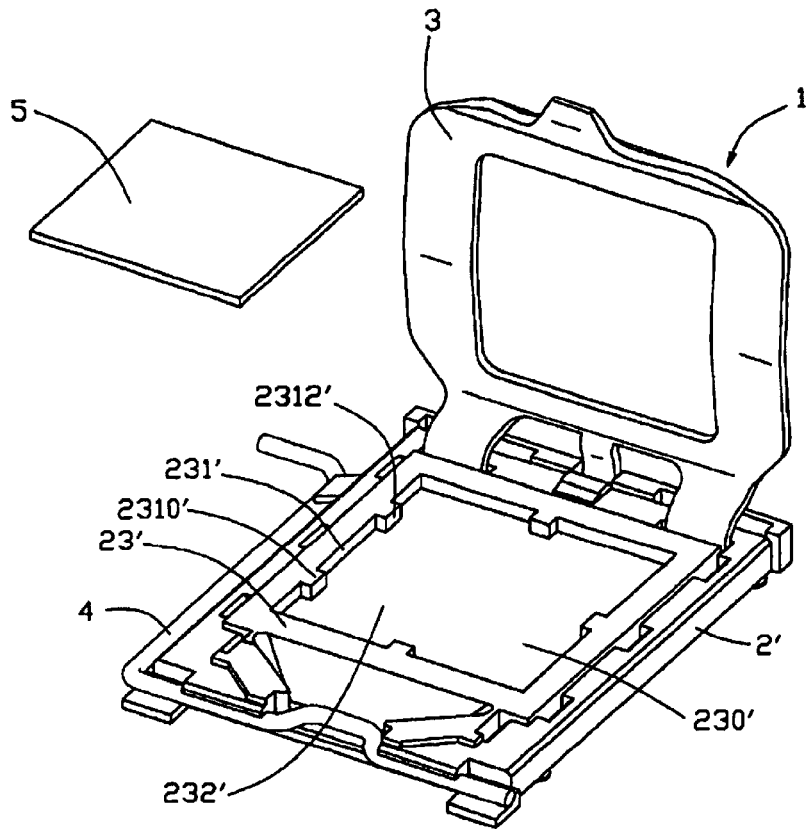

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-18 are cancelled.

Claim 19 is determined to be patentable as amended.

New claims 20-57 are added and determined to be patentable.

19. An electrical component for receiving an integrated circuit chip, comprising:
   a base including therein a substantially rectangular cavity defining thereof lengthwise and transverse directions perpendicular to each other;
   first, second, third and fourth side walls together surrounding said cavity circumferentially, wherein said first and fourth side walls extend along the lengthwise direction and the second and third side walls extend along the transverse direction;
   *a floor integrally formed as one piece together with said first, second, third, and fourth side walls, wherein said cavity is bounded by said floor and said side walls;*
   at least the first side wall defining a pair of substantially protrusions inwardly extending toward the cavity from an inner face thereof; and
   at least one projection inwardly extending from a corresponding inner face of each of the remaining second, third and fourth side walls toward the cavity; wherein
   said pair of protrusions on said first side wall are substantially similar to each other and located symmetrically located by two sides of a middle point of said first side wall; whereby under a warpage of said side walls along either the lengthwise or the transverse direction, a first line linked between two respective innermost points of said pair of protrusions is able to be essentially parallel to the lengthwise direction of a true position of the electrical component, so other two second and third lines respectively passing the respective two innermost points of the projections of the second and third side walls, which directly neighbor said first side wall, are in a perpendicular relation with regard to the first line and essentially parallel to the transverse direction, and a fourth line passing the innermost point of the projection of the fourth side wall opposite to the first side wall is in a parallel relation with regard to the first line and essentially parallel to the lengthwise direction, and thus said first, second, third and fourth side walls commonly define a rectangular region for compliance with a contour of said integrated circuit chip, wherein each of said protrusions defines a flat interior face normally facing the cavity.

20. *An electrical connector for interconnecting an integrated circuit chip and a printed circuit board, the electrical connector comprising:*
   *a base comprising a support area, a substantially rectangular cavity in the support area, the cavity being bounded by a floor and a plurality of peripheral side walls;*
   *wherein each of the side walls defines at least one protrusion thereon extending into the cavity, at least one of the side walls defines at least two protrusions thereon extending into the cavity, and said at least two protrusions extend a same distance from the side wall;*
   *wherein each of the protrusions has a substantially parallelepiped-shaped configuration; and*
   *wherein at least one of said at-least-one-protrusion-defining side walls defines said at least one protrusion at a position spaced away from each end region of its defining side wall.*

21. *The electrical connector as claimed in claim 20, wherein one of said two protrusions is positioned between a midpoint of its defining side wall and one end region of its defining side wall and the second of said two protrusions is positioned between the midpoint of its defining side wall and the other end region of its defining side wall.*

22. *An electrical connector for interconnecting an integrated circuit chip and a printed circuit board, the electrical connector comprising:*
   *a base comprising a support area, a substantially rectangular cavity in the support area, the cavity being bounded by a floor and a plurality of peripheral side walls, wherein the floor and peripheral side walls are integrally formed together as one piece;*
   *wherein each of the side walls defines at least one protrusion thereon extending into the cavity, at least one of the side walls defines at least two protrusions thereon extending into the cavity, and said at least two protrusions extend a same distance from the side wall;*
   *wherein each of the protrusions has a substantially parallelepiped-shaped configuration.*

23. *The electrical connector as claimed in claim 22, wherein the base is substantially rectangular.*

24. *The electrical connector as claimed in claim 22, wherein only one of the side walls defines two protrusions thereon, and each of the other side walls defines only a single protrusion thereon.*

25. *The electrical connector as claimed in claim 24, wherein the two protrusions on said one side wall are disposed far away from each other, and are equidistant from a midpoint of the side wall.*

26. *The electrical connector as claimed in claim 22, wherein each of the side walls defines two protrusions thereon.*

27. *The electrical connector as claimed in claim 26, wherein the protrusions are defined at opposite ends of each of the side walls.*

28. *The electrical connector as claimed in claim 27, wherein two adjacent protrusions at each of two adjoining side walls are integrally formed together to provide an L-shaped configuration.*

29. *The electrical connector as claimed in claim 28, wherein a recess is defined at each of the corners of the support area where two integrated protrusions are disposed.*

30. *An electrical connector assembly for interconnecting an integrated circuit chip and a printed circuit board, the electrical connector comprising:*
   *a base comprising a support area, the support area comprising a floor and a plurality of side walls cooperatively defining a cavity therebetween, wherein the floor and the side walls are integrally formed together as one piece;* wherein at least one of the side walls defines at least two protrusions, and each of the other side walls defines one protrusion respectively, each of the protrusions defines an inner surface parallel to the corresponding side wall, and the inner surfaces of said at least two protrusions are coplanar.

31. The electrical connector as claimed in claim 30, wherein the cavity has a substantially rectangular configuration.

32. The electrical connector as claimed in claim 30, wherein each of the protrusions has a substantially parallelepiped-shaped configuration.

33. The electrical connector as claimed in claim 30, wherein the base is substantially rectangular.

34. The electrical connector as claimed in claim 30, wherein only one of the side walls defines two protrusions, and each of the other side walls defines only one protrusion.

35. The electrical connector as claimed in claim 34, wherein the two protrusions on said one side wall are disposed far away from each other, and are equidistant from a midpoint of the side wall.

36. The electrical connector as claimed in claim 30, wherein each of the side walls defines two protrusions.

37. The electrical connector as claimed in claim 36, wherein the protrusions are defined at opposite ends of each of the side walls.

38. The electrical connector as claimed in claim 37, wherein two adjacent protrusions at each of two adjoining side walls are integrally formed together to provide an L-shaped configuration.

39. The electrical connector as claimed in claim 38, wherein a recess is defined at each of the corners of the support area where two integrated protrusions are disposed.

40. An electrical connector for interconnecting an integrated circuit chip and a printed circuit board, the electrical connector comprising:

a base comprising a support area, a substantially rectangular cavity in the support area, the cavity being bounded by a floor and a plurality of peripheral side walls, wherein the floor and peripheral side walls are monolithically formed;

wherein each of the side walls defines at least one protrusion thereon extending into the cavity, at least one of the side walls defines at least two protrusions thereon extending into the cavity, and said at least two protrusions extend a same distance from the side wall;

wherein each of the protrusions has a substantially parallelepiped-shaped configuration.

41. The electrical connector as claimed in claim 40, wherein the base is substantially rectangular.

42. The electrical connector as claimed in claim 40, wherein only one of the side walls defines two protrusions thereon, and each of the other side walls defines only a single protrusion thereon.

43. The electrical connector as claimed in claim 42, wherein the two protrusions on said one side wall are disposed far away from each other, and are equidistant from a midpoint of the side wall.

44. The electrical connector as claimed in claim 40, wherein each of the side walls defines two protrusions thereon.

45. The electrical connector as claimed in claim 44, wherein the protrusions are defined at opposite ends of each of the side walls.

46. The electrical connector as claimed in claim 45, wherein two adjacent protrusions at each of two adjoining side walls are integrally formed together to provide an L-shaped configuration.

47. The electrical connector as claimed in claim 46, wherein a recess is defined at each of the corners of the support area where two integrated protrusions are disposed.

48. An electrical connector assembly for interconnecting an integrated circuit chip and a printed circuit board, the electrical connector comprising:

a base comprising a support area, the support area comprising a floor and a plurality of side walls cooperatively defining a cavity therebetween, wherein the floor and the side walls are monolithically formed;

wherein at least one of the side walls defines at least two protrusions, and each of the other side walls defines one protrusion respectively, each of the protrusions defines an inner surface parallel to the corresponding side wall, and the inner surfaces of said at least two protrusions are coplanar.

49. The electrical connector as claimed in claim 48, wherein the cavity has a substantially rectangular configuration.

50. The electrical connector as claimed in claim 48, wherein each of the protrusions has a substantially parallelepiped-shaped configuration.

51. The electrical connector as claimed in claim 48, wherein the base is substantially rectangular.

52. The electrical connector as claimed in claim 48, wherein only one of the side walls defines two protrusions, and each of the other side walls defines only one protrusion.

53. The electrical connector as claimed in claim 52, wherein the two protrusions on said one side wall are disposed far away from each other, and are equidistant from a midpoint of the side wall.

54. The electrical connector as claimed in claim 48, wherein each of the side walls defines two protrusions.

55. The electrical connector as claimed in claim 54, wherein the protrusions are defined at opposite ends of each of the side walls.

56. The electrical connector as claimed in claim 55, wherein two adjacent protrusions at each of two adjoining side walls are integrally formed together to provide an L-shaped configuration.

57. The electrical connector as claimed in claim 56, wherein a recess is defined at each of the corners of the support area where two integrated protrusions are disposed.

* * * * *

(12) EX PARTE REEXAMINATION CERTIFICATE (10217th)
United States Patent
Ma et al.

(10) Number: US 6,908,316 C2
(45) Certificate Issued: Jul. 2, 2014

(54) ELECTRICAL CONNECTOR WITH ACCURATE MEASURING BENCHMARKS

(75) Inventors: Hao-Yun Ma, Tu-chen (TW); Genn-Sheng Lee, Tu-Chen (TW); Ming-Lun Szu, Tu-Chen (TW)

(73) Assignee: Hon Hai Precision Ind. Co., Ltd., Tu-Chen, Taipei Hsien (TW)

Reexamination Request:
No. 90/012,250, Apr. 11, 2012

Reexamination Certificate for:
Patent No.: 6,908,316
Issued: Jun. 21, 2005
Appl. No.: 10/685,836
Filed: Oct. 14, 2003

Reexamination Certificate C1 6,908,316 issued Feb. 28, 2012

(30) Foreign Application Priority Data

Feb. 27, 2003 (TW) .............................. 92203129 U

(51) Int. Cl.
*H05K 7/10* (2006.01)
(52) U.S. Cl.
USPC ............................................. 439/73; 439/331

(58) Field of Classification Search
None
See application file for complete search history.

(56) References Cited

To view the complete listing of prior art documents cited during the proceeding for Reexamination Control Number 90/012,250, please refer to the USPTO's public Patent Application Information Retrieval (PAIR) system under the Display References tab.

*Primary Examiner* — Erik Kielin

(57) ABSTRACT

An electrical connector includes a base (2'), a metal clip (3) pivotably engaged on the base, and a ever (4) for fastening the clip onto the base. A floor (232') is defined in a middle of the base. A rectangular ratted support area (23') is provided around a periphery of the floor. The support area defines four inner side walls (231'). The side walls and the floor cooperatively define a substantially rectangular cavity (230') therebetween. one of the side walls defines a pair of protrusions (2310') protruding towards the cavity, wherein the two protrusions are coplanar with each other. The other side walls define a protrusion thereof respectively. Therefore, a first benchmark is obtained by a line joining the pair of protrusions on the side wall, and a second benchmark is determined by a line passing the protrusion on the adjacent and perpendicular side wall, perpendicular to the first benchmark.

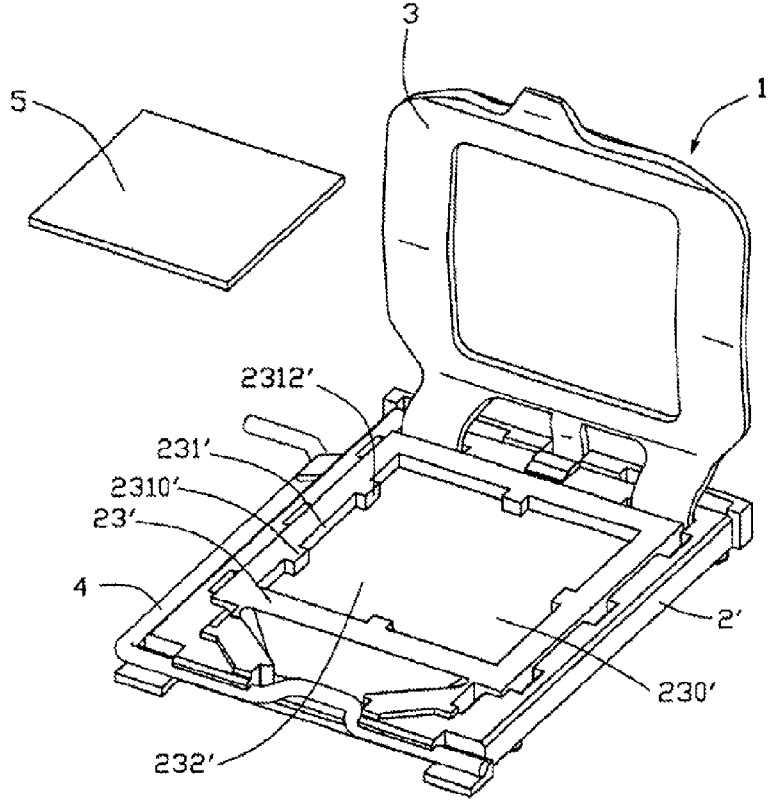

1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 20 and 21 is confirmed.

Claims 1-18 were previously cancelled.

Claims 19, 22, 27-30, 37-40, 45-48 and 55-57 are determined to be patentable as amended.

Claims 23-26, 31-36, 41-44 and 49-54, dependent on an amended claim, are determined to be patentable.

New claims 58-61 are added and determined to be patentable.

19. An electrical component for receiving an integrated circuit chip, comprising:
 a base including therein a substantially rectangular cavity defining thereof lengthwise and transverse directions perpendicular to each other;
 first, second, third and fourth side walls together surrounding said cavity circumferentially, wherein said first and fourth side walls extend along the lengthwise direction and the second and third side walls extend along the transverse direction;
 a floor integrally formed as one piece together with said first, second, third, and fourth side walls, wherein said cavity is bounded by said floor and said side walls;
 at least the first side wall defining a pair of substantially protrusions inwardly extending toward the cavity from an inner face thereof; and
 at least one projection inwardly extending from a corresponding inner face of each of the remaining second, third and fourth side walls toward the cavity; *wherein at least one of the projections is located at a position spaced away from each end region of its corresponding inner face*; wherein
 said pair of protrusions on said first side wall are substantially similar to each other and located symmetrically located by two sides of a middle point of said first side wall; whereby under a warpage of said side walls along either the lengthwise or the transverse direction, a first line linked between two respective innermost points of said pair of protrusions is able to be essentially parallel to the lengthwise direction of a true position of the electrical component, so other two second and third lines respectively passing the respective two innermost points of the projections of the second and third side walls, which directly neighbor said first side wall, are in a perpendicular relation with regard to the first line and essentially parallel to the transverse direction, and a fourth line passing the innermost point of the projection of the fourth side wall opposite to the first side wall is in a parallel relation with regard to the first line and essentially parallel to the lengthwise direction, and thus said first, second, third and fourth side walls commonly define a rectangular region for compliance with a contour of said integrated circuit chip, wherein each of said protrusions defines a flat interior face normally facing the cavity.

22. An electrical connector for interconnecting an integrated circuit chip and a printed circuit board, the electrical connector comprising:
 a base comprising a support area, a substantially rectangular cavity in the support area, the cavity being bounded by a floor and a plurality of peripheral side walls, wherein the floor and peripheral side walls are integrally formed together as one piece;
 wherein each of the side walls defines at least one protrusion thereon extending into the cavity, at least one of the side walls defines at least two protrusions thereon extending into the cavity, and said at least two protrusions extend a same distance from the side wall;
 *wherein at least one of the protrusions is defined at a position spaced away from each end region of its defining side wall;*
 wherein each of the protrusions has a substantially parallelepiped-shaped configuration.

27. The electrical connector as claimed in claim 26, wherein [the protrusions are defined at opposite ends of each of the side walls] *one of said two protrusions on each of the side walls is positioned between a midpoint of its defining side wall and one end region of its defining side wall and the second of said two protrusions is positioned between the midpoint of its defining side wall and the other end region of its defining side wall*.

28. The electrical connector as claimed in claim 27, wherein [two adjacent protrusions at each of two adjoining side walls are integrally formed together to provide an L-shaped configuration] *said two protrusions on each of the side walls are equidistant from a midpoint of the side wall*.

29. The electrical connector as claimed in claim [28] *22*, wherein [a recess is defined at each of the corners of the support area where two integrated protrusions are disposed] *one of said two protrusions is positioned between a midpoint of its defining side wall and one end region of its defining side wall and the second of said two protrusions is positioned between the midpoint of its defining side wall and the other end region of its defining side wall*.

30. An electrical connector assembly for interconnecting an integrated circuit chip and a printed circuit board, the electrical connector comprising:
 a base comprising a support area, the support area comprising a floor and a plurality of side walls cooperatively defining a cavity therebetween, wherein the floor and the side walls are integrally formed together as one piece;
 wherein at least one of the side walls defines at least two protrusions, and each of the other side walls defines one protrusion respectively, each of the protrusions defines an inner surface parallel to the corresponding side wall, and the inner surfaces of said at least two protrusions are coplanar;
 *wherein at least one of the protrusions is defined at a position spaced away from each end region of its defining side wall*.

37. The electrical connector as claimed in claim 36, wherein [the protrusions are defined at opposite ends of each of the side walls] *one of said two protrusions on each of the side walls is positioned between a midpoint of its defining side wall and one end region of its defining side wall and the second of said two protrusions is positioned between the midpoint of its defining side wall and the other end region of its defining side wall*.

38. The electrical connector as claimed in claim 37, wherein [two adjacent protrusions at each of two adjoining side walls are integrally formed together to provide an L-shaped configuration] *said two protrusions on each of the side walls are equidistant from a midpoint of the side wall.*

39. The electrical connector as claimed in claim [38] *30*, wherein [a recess is defined at each of the corners of the support area where two integrated protrusions are disposed] *one of said two protrusions is positioned between a midpoint of its defining side wall and one end region of its defining side wall and the second of said two protrusions is positioned between the midpoint of its defining side wall and the other end region of its defining side wall.*

40. An electrical connector for interconnecting an integrated circuit chip and a printed circuit board, the electrical connector comprising:
  a base comprising a support area, a substantially rectangular cavity in the support area, the cavity being bounded by a floor and a plurality of peripheral side walls, wherein the floor and peripheral side walls are monolithically formed;
  wherein each of the side walls defines at least one protrusion thereon extending into the cavity, at least one of the side walls defines at least two protrusions thereon extending into the cavity, and said at least two protrusions extend a same distance from the side wall;
  *wherein at least one of the protrusions is defined at a position spaced away from each end region of its defining side wall;*
  wherein each of the protrusions has a substantially parallelepiped-shaped configuration.

45. The electrical connector as claimed in claim 44, wherein [the protrusions are defined at opposite ends of each of the side walls] *one of said two protrusions on each of the side walls is positioned between a midpoint of its defining side wall and one end region of its defining side wall and the second of said two protrusions is positioned between the midpoint of its defining side wall and the other end region of its defining side wall.*

46. The electrical connector as claimed in claim 45, wherein [two adjacent protrusions at each of two adjoining side walls are integrally formed together to provide an L-shaped configuration] *said two protrusions on each of the side walls are equidistant from a midpoint of the side wall.*

47. The electrical connector as claimed in claim [46] *40*, wherein [a recess is defined at each of the corners of the support area where two integrated protrusions are disposed] *one of said two protrusions is positioned between a midpoint of its defining side wall and one end region of its defining side wall and the second of said two protrusions is positioned between the midpoint of its defining side wall and the other end region of its defining side wall.*

48. An electrical connector assembly for interconnecting an integrated circuit chip and a printed circuit board, the electrical connector comprising:
  a base comprising a support area, the support area comprising a floor and a plurality of side walls cooperatively defining a cavity therebetween, wherein the floor and the side walls are monolithically formed;
  wherein at least one of the side walls defines at least two protrusions, and each of the other side walls defines one protrusion respectively, each of the protrusions defines an inner surface parallel to the corresponding side wall, and the inner surfaces of said at least two protrusions are coplanar;
  *wherein at least one of the protrusions is defined at a position spaced away from each end region of its defining side wall.*

55. The electrical connector as claimed in claim 54, wherein [the protrusions are defined at opposite ends of each of the side walls] *one of said two protrusions on each of the side walls is positioned between a midpoint of its defining side wall and one end region of its defining side wall and the second of said two protrusions is positioned between the midpoint of its defining side wall and the other end region of its defining side wall.*

56. The electrical connector as claimed in claim 55, wherein [two adjacent protrusions at each of two adjoining side walls are integrally formed together to provide an L-shaped configuration] *said two protrusions on each of the side walls are equidistant from a midpoint of the side wall.*

57. The electrical connector as claimed in claim [56] *48*, wherein [a recess is defined at each of the corners of the support area where two integrated protrusions are disposed] *one of said two protrusions is positioned between a midpoint of its defining side wall and one end region of its defining side wall and the second of said two protrusions is positioned between the midpoint of its defining side wall and the other end region of its defining side wall.*

*58. The electrical connector as claimed in claim 22, wherein each of the side walls has a uniform height along the entire wall length.*

*59. The electrical connector as claimed in claim 30, wherein each of the side walls has a uniform height along the entire wall length.*

*60. The electrical connector as claimed in claim 40, wherein each of the side walls has a uniform height along the entire wall length.*

*61. The electrical connector as claimed in claim 48, wherein each of the side walls has a uniform height along the entire wall length.*

\* \* \* \* \*